United States Patent
Poddar et al.

(10) Patent No.: US 7,354,802 B1
(45) Date of Patent: Apr. 8, 2008

(54) THERMAL RELEASE WAFER MOUNT TAPE WITH B-STAGE ADHESIVE

(75) Inventors: Anindya Poddar, Sunnyvale, CA (US); Chetan Paydenkar, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 7 days.

(21) Appl. No.: 11/491,316

(22) Filed: Jul. 21, 2006

Related U.S. Application Data

(62) Division of application No. 10/935,883, filed on Sep. 7, 2004, now Pat. No. 7,101,620.

(51) Int. Cl.
*H01L 21/00* (2006.01)
*B32B 7/12* (2006.01)

(52) U.S. Cl. .......... 438/113; 438/118; 428/354
(58) Field of Classification Search ........... 257/783, 257/734, 782, E23.034, E23.055; 428/41.9, 428/42.2, 40.1, 42.3, 354, 355 EP
See application file for complete search history.

(56) References Cited

U.S. PATENT DOCUMENTS

| | | | |
|---|---|---|---|
| 3,772,064 A | 11/1973 | Mendelsohn et al. | |
| 4,442,137 A | 4/1984 | Kumar | |
| 5,316,853 A | 5/1994 | Shibata et al. | |
| 5,356,949 A | 10/1994 | Komiyama et al. | |
| 5,597,767 A | 1/1997 | Mignardi et al. | |
| 5,827,394 A | 10/1998 | Lu | |
| 5,923,995 A | 7/1999 | Kao et al. | |
| 5,960,260 A | 9/1999 | Umehara et al. | |
| 6,023,094 A | 2/2000 | Kao et al. | |
| 6,175,162 B1 | 1/2001 | Kao et al. | |
| 6,176,966 B1 | 1/2001 | Tsujimoto et al. | |
| 6,214,703 B1 | 4/2001 | Chen et al. | |
| 6,235,366 B1 | 5/2001 | Matsumoto et al. | |
| 6,319,754 B1 | 11/2001 | Wang et al. | |
| 6,383,833 B1 | 5/2002 | Silverbrook | |
| 6,398,892 B1 | 6/2002 | Noguchi et al. | |
| 6,444,310 B1 | 9/2002 | Senoo et al. | |

(Continued)

FOREIGN PATENT DOCUMENTS

JP    54-131537    10/1979

*Primary Examiner*—Lex Malsawma
(74) *Attorney, Agent, or Firm*—Beyer Weaver LLP

(57) ABSTRACT

In one aspect, an improved wafer mount tape is provided. The wafer mount tape includes a base layer, a release layer that expands when activated and a B-stageable adhesive layer that is positioned over the release layer. In a method aspect of the invention, a wafer level method of placing an adhesive layer on the back surface of integrated circuit devices is described. In this aspect, a wafer is secured to the mount tape. The wafer is diced while the wafer is attached to the mounting tape. After the wafer has been diced and any other desired wafer level processing is completed, the dice may be released individually or in groups by heating (or otherwise activating) localized areas of the tape under selected die to a temperature sufficient to release the selected die. The expansion of the release layer during the release operation serves to lift the selected die relative to adjacent die thereby facilitating picking. The B-stageable adhesive layer remains secured to the back surface of the die and therefore may be used to attach the respective dice to associated support structures.

8 Claims, 5 Drawing Sheets

U.S. PATENT DOCUMENTS

| | | |
|---|---|---|
| 6,610,167 B1 | 8/2003 | Glenn et al. |
| 6,623,594 B1 | 9/2003 | Yamamoto et al. |
| 6,702,910 B2 | 3/2004 | Noguchi et al. |
| 6,709,953 B2 | 3/2004 | Vasquez et al. |
| 6,873,059 B2 | 3/2005 | Amagai et al. |
| 2003/0143819 A1 | 7/2003 | Hedler et al. |
| 2004/0104491 A1 | 6/2004 | Connell et al. |
| 2004/0106233 A1* | 6/2004 | Lin et al. .................... 438/108 |
| 2004/0161876 A1 | 8/2004 | Tandy et al. |
| 2004/0191510 A1* | 9/2004 | Kiuchi et al. ......... 428/355 RA |
| 2005/0070095 A1 | 3/2005 | Sharan et al. |

* cited by examiner

THERMAL RELEASE WAFER MOUNT TAPE WITH B-STAGE ADHESIVE

CROSS REFERENCE TO RELATED APPLICATIONS

This application is a Divisional of U.S. patent application Ser. No. 10/935,883 filed on Sep. 7, 2004, now U.S. Pat. No. 7,101,620 which is incorporated herein by reference.

FIELD OF THE INVENTION

The present invention relates generally to the packaging of integrated circuits. More particularly, the invention relates to improved wafer mount tapes and wafer level methods for applying adhesive coatings to the back surface of semiconductor dice.

BACKGROUND

There are a number of conventional processes for packaging integrated circuits. In many packages it is desirable to attach the integrated circuit die to some type of a supporting structure (e.g. a substrate, a lead frame, a stacked die, etc.). There are a variety of methods that are commonly used to attach dice to supporting structures. In many processes, an adhesive paste is applied to either the back surface of the die or the supporting structure. More recently, wafer mount tapes have been developed that include a B-stageable adhesive film layer over a base layer. The B-stageable adhesive film is designed to adhere well enough to the back surface of a wafer before it is fully cured to hold the wafer firmly in place during wafer sawing operations. After the wafer has been diced, the base layer is activated (e.g., by exposure to UV radiation) to "release" the B-stageable adhesive layer which remains secured to the back surface of the singulated dice. The B-stageable adhesive layer may then be used as the die attach adhesive. It should be appreciated that these mounting tapes provide a good wafer level mechanism for applying an adhesive to the back surface of semiconductor dice.

There are a variety of techniques for picking singulated dice from a wafer supported by a wafer mount tape. Some existing picking techniques utilize a pin or needle type structure to push a selected die up from the backside of the wafer mount tape (i.e., by pushing up on the mounting tape underneath the selected die). The pin structure pushes the selected die up relative to its neighbors so that it may be grasped by suitable pick and place equipment. Although this approach works well in many circumstances, it can be difficult to pick very thin dice (e.g., dice having a thickness of 100 microns or less) using this approach because the needle structure may break, crack or otherwise damage the fragile dice. Another pick and place approach contemplates the use of a vacuum pickup head. Although vacuum pickup works well in many circumstances, with smaller footprint dice, it can sometimes be difficult to pick a single die at a time using a vacuum pickup head.

More recently, Nitto Denko has developed a mounting tape having an adhesive that effectively foams at a designated temperature. The foaming causes the adhesive to both lose its adhesive properties and to expand. This provides a thermal releasing adhesive that can effectively lift a die with minimal mechanical stress. These thermally releasing mount tapes are well suited for facilitating pickup in very thin chips.

Although the described techniques work well in many applications, in the semiconductor industry, there are continuing efforts to increase device yield per wafer or lot and reduce the costs and time associated with semiconductor fabrication and packaging. The present invention seeks to provide more efficient approaches to applying an adhesive layer to dice at the wafer level. The described approaches are particularly useful in handling ultra-thin chips.

SUMMARY

To achieve the foregoing and other objects of the invention in one aspect of the invention, an improved wafer mount tape is described. In another aspect of the invention, a wafer level method of forming an adhesive protective coating on the back surface of integrated circuit devices is described.

In the wafer mount tape aspect of the invention, the wafer mount tape includes a base layer, an expandable release layer and a B-stageable adhesive layer that cooperates with the base layer to sandwich the release layer. The expansion of the release layer can be used to lift a selected die relative to other dice during a picking operation. The expandable release layer may be a thermal release adhesive layer that is arranged to expand when heated to a release temperature. When a thermal release layer is used, the thermal release layer is activated at a lower temperature than the cure temperature for the B-stageable adhesive layer.

In a method aspect of the invention, a wafer level method of placing an adhesive layer on the back surface of integrated circuit devices is described. In this aspect, a wafer is secured to a mount tape having a B-stageable adhesive layer, an expandable release layer and a base layer. The wafer is diced while the wafer is attached to the mounting tape. The dicing is arranged to cut entirely through the wafer and the adhesive layer but not fully through the base layer. After the wafer has been diced and any other desired wafer level processing is completed, the dice may be individually released by heating (or otherwise activating) localized areas of the tape under selected dice to a temperature sufficient to release the selected dice. The expansion of the release layer during the release operation serves to lift a selected die relative to adjacent dice thereby facilitating picking. The B-stageable adhesive layer remains secured to the back surface of the die and therefore may be used as a die attach adhesive to attach the respective dice to any suitable support structure (e.g., a substrate, a leadframe or a stacked die).

In some embodiments, the dice are individually sequentially released and picked from the wafer mount tape. Each die may then be secured to a suitable supporting structure by heating the adhesive layer on the die to a temperature suitable to cure the B-stageable adhesive layer or otherwise cause the adhesive to adhere the selected die to the supporting structure.

In some embodiments, the wafer dicing is arranged to cut partially or fully through the release layer wafer (in addition to the wafer and adhesive layer) but to minimally cut into or leave intact the base layer such that the base layer of the mount tape remains substantially intact with a multiplicity of singulated integrated circuit dice thereon.

The described approach can be used to form integrated circuits dice having integrally formed adhesive coatings. The thicknesses of the adhesive layers and resulting dice may vary widely and the described processes are well suited for use with very thin dice. By way of example, adhesive coatings in the range of 12 to 50 microns are readily obtainable and dice having thickness of less than approximately 70 microns may readily be formed using the described techniques.

In various other embodiments, the mount tape may include additional layers that may be useful for specific purposes.

BRIEF DESCRIPTION OF THE DRAWINGS

The invention, together with further objects and advantages thereof, may best be understood by reference to the following description taken in conjunction with the accompanying drawings in which.

In the drawings, like reference numerals generally designate like structural elements. Also, it should be understood that the depictions in the figures are not to scale.

DETAILED DESCRIPTION

The present invention relates generally to novel wafer mount tapes and wafer level methods of applying an adhesive coating to the back surface of a wafer. In the following description, representative embodiments of the invention are described to aid in the understanding of the invention. However, it should be apparent to those skilled in the art that the present invention may be practiced without some or all of these specific details. In other instances, well known process operations have not been described in detail in order to avoid unnecessarily obscuring the present invention.

Figure 1:
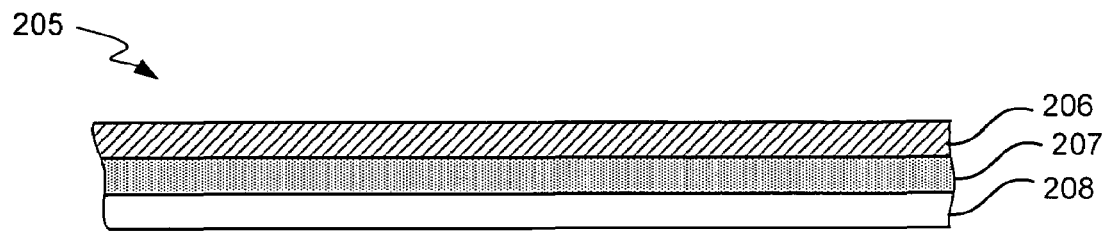
FIG. 1 is a diagrammatic cross sectional view of a wafer mount tape formed in accordance with one embodiment of the present invention.

Referring initially to FIG. 1, a multi-layered mount tape 205 formed in accordance with one embodiment of the invention will be described. The tape 205 includes a first layer 206 formed from a "B-stageable adhesive" material that will be permanently affixed to the back side of the wafer, a second layer 207 formed from an expandable releasing adhesive material, and a base layer 208. The B-stageable adhesive layer 206 is formed from a material with good adhesive properties when it is set but not fully cured (e.g., the first stage), so that it can securely hold a wafer during wafer handling operations such as wafer sawing. Generally, the B-stageable adhesive layer 206 must be compatible with both the wafer and the support structure that the singulated dice are intended to be mounted on. By way of example, there are a number of B-stageable epoxy compositions that are compatible with and adhere well to the back surface of semiconductor wafers and the commonly used support structures.

The expandable release layer 207 may be formed from a releasable adhesive material. The material for the release layer is chosen such that it strongly adheres to the adhesive layer 206 and the base layer 208 until it is "released", as for example, by thermal heating. The expandable release layer 207 is also arranged so that it swells or expands when it releases. The base layer 208 may be formed from a variety of materials, as for example polyester. As will be explained in more detail below, the described arrangement provides a good mechanism for applying an adhesive layer to the back surface of a wafer.

The mounting tape 205 may be formed in any suitable manner. By way of example, the adhesive layer 206 and the expandable release layer 207 may be applied to a base layer film in either paste or film form. Suitable B-stageable epoxies and thermally releasable adhesives are available from Nitto Denko. One specific adhesive material that is suitable for use as the expandable release layer 207 is marketed by Nitto Denko in film form together with a base layer as a thermal release sheet under the trade name REVALPHA.

Figure 4:
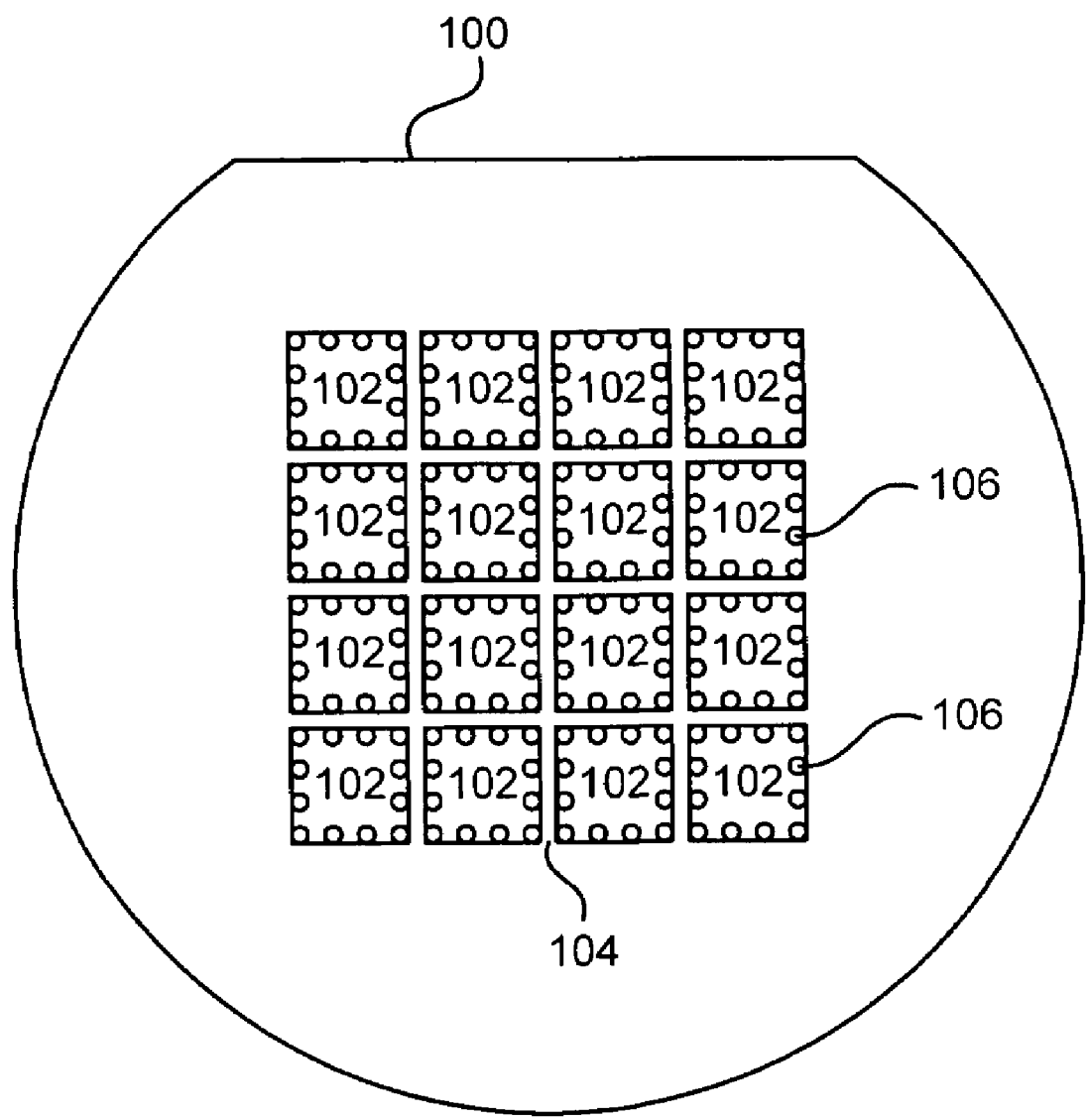
FIG. 4 illustrates in top plan view an exemplary wafer having a number of semiconductor dice.

Referring now to FIG. 2(a)-2(e) a representative method of applying an adhesive coating to the back surface of wafer 100 using the wafer mount tape 205 illustrated in FIG. 1 will be described. FIGS. 2(a)-2(e), are diagrammatic cross sectional views of a segment of a wafer at various stages in the process of applying an adhesive coating 206 to the back surface of a wafer 100 in accordance with an embodiment of the present invention. Initially, a wafer 100 is fabricated using conventional and/or appropriate wafer fabrication techniques. A representative wafer 100 is diagrammatically illustrated in FIG. 4. The illustrated wafer 100 has a plurality of dice 102 separated by horizontal and vertical scribe lines 104. Each of the dice 102 includes a plurality of I/O pads 106 that may be used to electrically connect internal circuits to components outside of the die. The I/O pads may take any suitable form. By way of example, they may take the form of bond pads suitable for wire bonding. Alternatively they may take the form of contact pads suitable for supporting a solder ball or any other suitable electrical contacts.

It should be noted that while only a relatively small number of dice 102 are shown on the wafer 100 for purposes of illustration, most wafers have significantly more dice formed thereon. By way of example, current state of the art wafers typically have several hundred to several thousand dice formed thereon, and some have more than ten thousand dice. As is well known in the art, most wafers and dice are formed of silicon, although any other appropriate semiconductor material can also be used, including, for example, gallium arsenide (GaAs), indium gallium phosphide, silicon germanium, and the like.

Figure 2A:
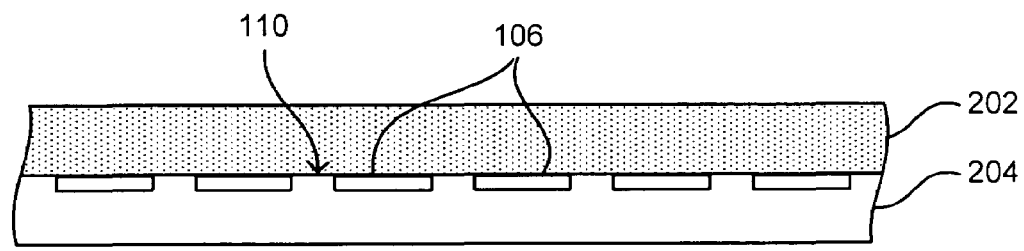
FIGS. 2(a)-2(e) are diagrammatic cross sectional views of a section of a wafer at various stages of production in accordance with an embodiment of the present invention.

In many semiconductor applications it is considered desirable to reduce the height of the finished dice by "thinning" or backgrinding the wafer after fabrication. As illustrated in FIG. 2(a), one conventional approach for thinning a wafer contemplates applying a backgrind tape 202 to the active (front) surface of the wafer 100 (step 306) and then grinding the back surface of the wafer (step 308) using conventional techniques to reduce the thickness of the wafer. The resultant thinned wafer is diagrammatically illustrated in FIG. 2(a). In the illustrated embodiment, the backgrind tape 202 covers both the I/O pads 106 and the active surface 110 of the wafer 100. The purpose of the backgrind tape is to stabilize the wafer during a backgrinding process. In this example, the backgrinding has already been completed such that the wafer is at its intended thickness. It should be appreciated that wafer thinning is an entirely optional step, although it is relatively common in many modern thin packaging processes.

Figure 2B:
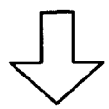
Figure 2B:
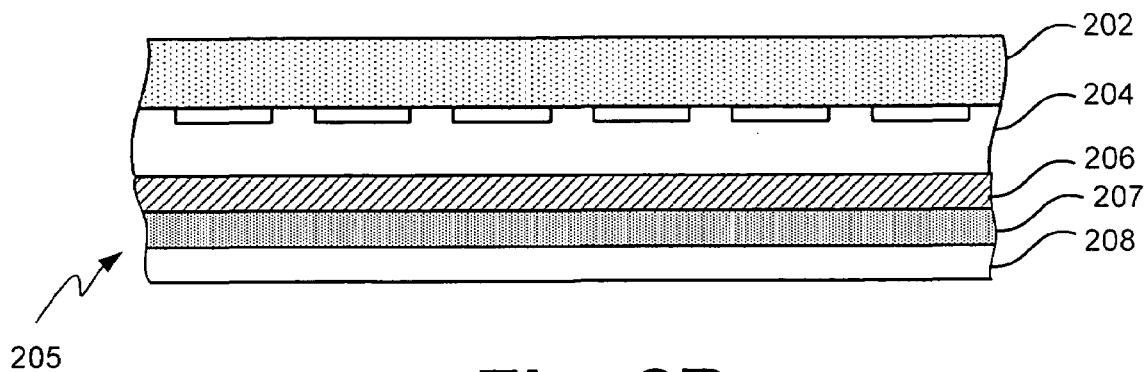
Figure 2C:
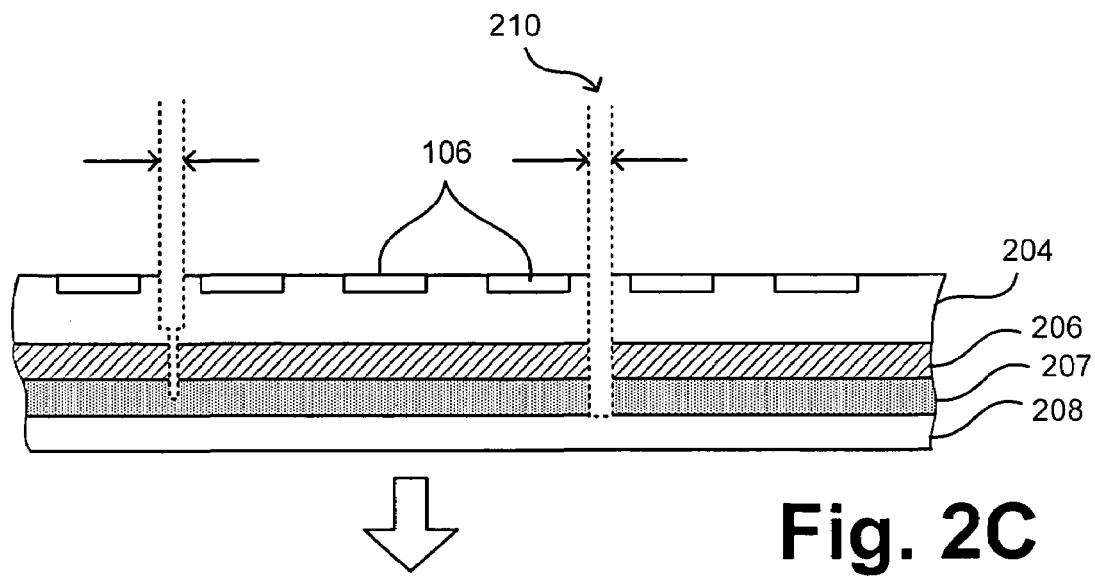

Once the wafer is at its desired thickness, a mount tape 205 is applied to the back surface of the wafer 100 as illustrated in FIG. 2(b). The mount tape 205 includes a B-stageable adhesive layer 206, a thermal release & expansion layer 207 and a base layer 208. The mount tape 205 may serve several functions including supporting the wafer during the subsequent wafer level handling. By way of example, the subsequent wafer handling operations may include singulation (e.g. by wafer sawing) and/or retaining the diced IC's for handling before picking.

After the mount tape 205 has been applied, the backgrind tape 202 may be removed and the wafer 100 may be diced using any of a number of methods known in the art. By way of example, wafer sawing (using either one pass or two pass cutting), laser cutting or other suitable singulation techniques may be used to dice the wafer. In the embodiment shown in FIG. 2(c), two different types of cuts are shown for the purposes of illustration. In the cut illustrated on the left hand side, a two pass cut is shown. In the cut illustrated on the right hand side, a single pass cut is shown. It should be appreciated that in normal dicing operations, only a single type of cut would typically be used, however there are many different variations of cutting that can be employed.

The single pass singulation cut 210(a) illustrated on the right hand side is cut to a depth that fully divides the wafer substrate 204, the adhesive layer 206 and the thermal release layer 207 of the tape 205, but only partially cuts or scores the base layer 208 of the tape. In the two pass singulation cut 210(b) illustrated in FIG. 2, the first cutting pass is arranged to cut partially, but not fully through the wafer 204. A second cutting pass (which is typically done using a thinner blade) is arranged to cut through the remainder of the wafer 204, the adhesive layer 206 and a portion of the thermal release layer 207. It should be appreciated that it is generally not necessary to cut all of the way through the thermal release layer. By way of example, cuts on the order of half way to two thirds of the way through the release layer work quite well. Of course, the relative depths of the first and second passes as well as the total depth of the combined cuts can be widely varied in accordance with the needs of a particular application. As will be appreciated by those familiar with the art, the single stage cut has some advantages, such as requiring less process steps, and the two stage cut has other advantages such as permitting the use of a blade in the first cutting pass that is optimized for cutting through the wafer.

In this manner, dicing proceeds until all of the IC devices have been singulated. The base layer 208 of the mounting tape 205 assures that the IC devices are securely held in place as a group, which may be desirable to facilitate picking, testing and/or further processing at the wafer level.

Figure 2D:
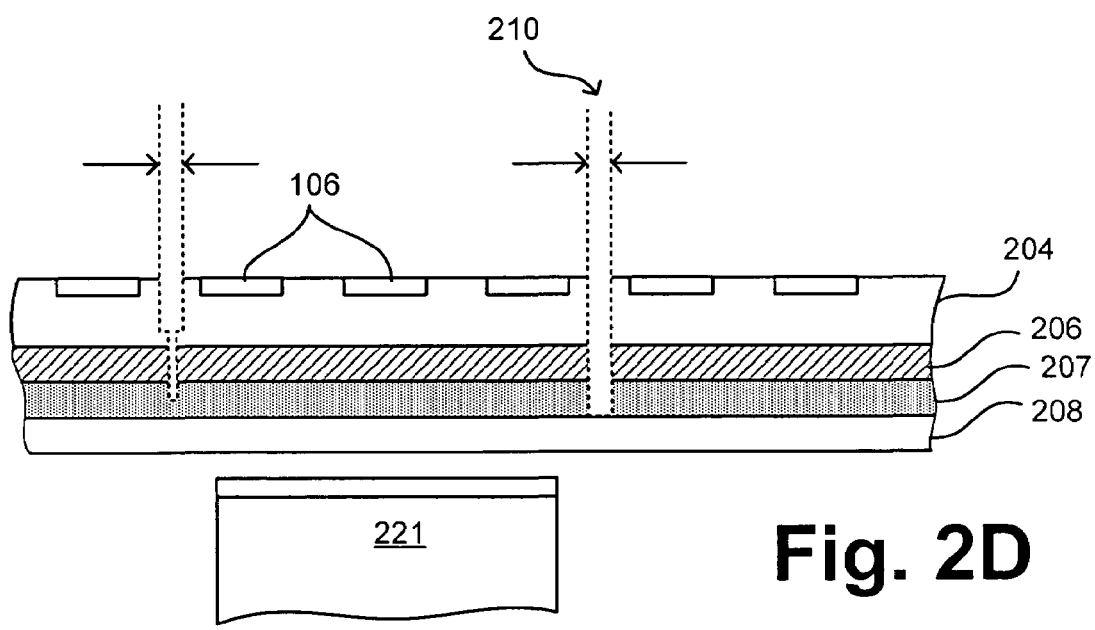
Figure 2E:
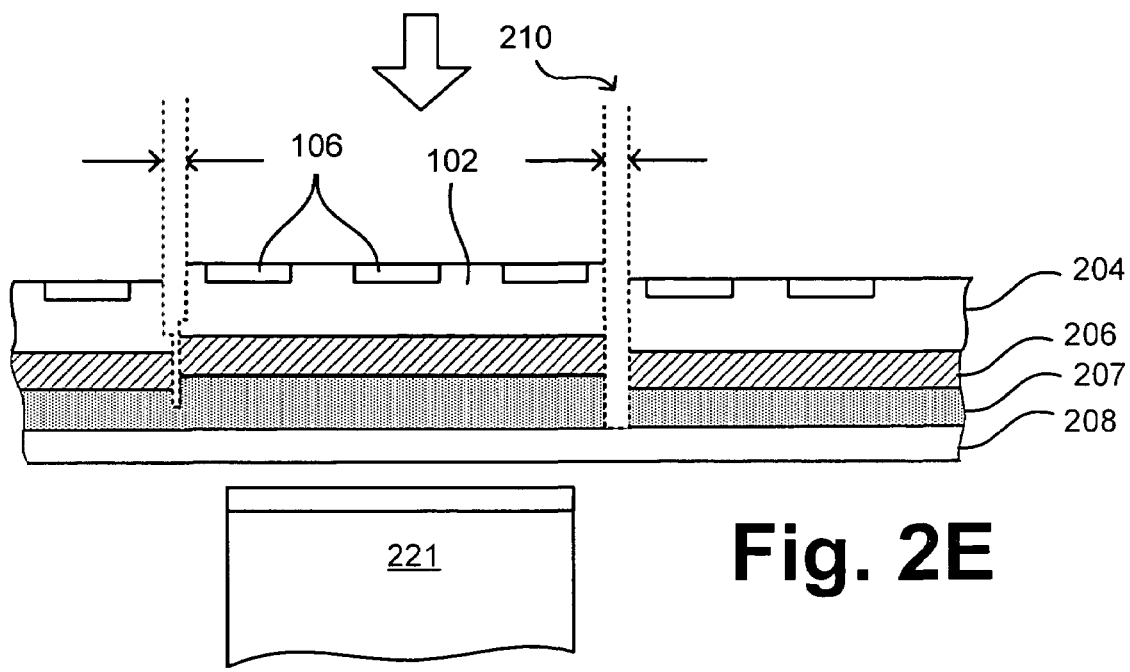
Figure 2F:
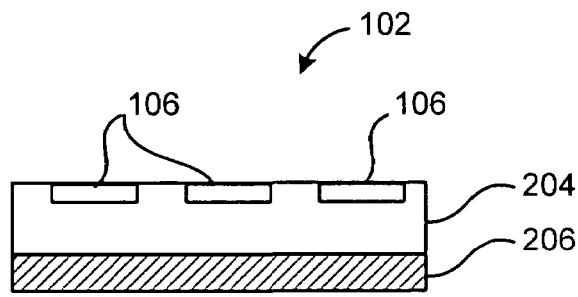
FIG. 2(f) is a diagrammatic cross section of a singulated die that has been separated from the wafer of FIGS. 2(a)-2(e).

Once the wafer has been diced and all of the desired wafer level processing has been accomplished, the dice may be removed from the mount tape 205. FIGS. 2(d) and 2(e) diagrammatically illustrate a suitable method of removing the dice from the mount tape. As described above, the release layer 207 is formed from an adhesive material that originally adheres very strongly to the adhesive layer 206, but it becomes substantially less sticky when it is activated by heating to a designated "activation" or "release" temperature. Additionally, when the release layer is activated, it expands. In some thermal release materials, the loss of adhesion and the expansion of the thermal release adhesive is due to the expansion of gas filled bubbles, seen as "foaming" that occurs when the thermal release adhesive is heated to or above the activation temperature.

The thermal releasing and expansion properties can then be used to facilitate the picking of dice from the wafer mount tape 205. Specifically, as illustrated in FIG. 2(d), a localized region of the wafer mount tape 205 underlying a selected die can be heated to the activation temperature using a thermal ejector 221 or any other suitable localized thermal heating mechanism. The ejector 221 preferably heats an area that is approximately the size of (or slightly smaller than) the size of the selected die. The heating of the localized area underlying the selected die causes the release layer 207 to lose much of its stickiness and expand, thereby raising the top surface of the selected die above its neighboring dice that are not overlying the heated area. Since the wafer sawing (or dicing) operation cut through the wafer substrate 204, the adhesive layer 206 and at least a portion of the thermal release layer 207 of the tape 205, the selected die and the corresponding portion of the adhesive layer are free to rise independent of the adjacent dice as illustrated in FIG. 2(e). Conventional pick and place machinery can then be used to pick the elevated die and place it in a desired location. The appearance of a singulated die that has been removed from the wafer mount tape is diagrammatically illustrated in FIG. 2(f).

The localized heating may be applied by a variety of means, including conductive, convective or radiation based heating. By way of example, a heated ejector head may be placed in direct contact with the wafer mount tape in order to activate the release layer. Alternatively, if a UV activated release layer is used, the ejector may direct radiation (as for example UV radiation) towards the selected die in order to activate the release layer. In another embodiment, focused light sources may be used to apply heat to activate the release layer. In some arrangements, the light may be applied from the top side of the wafer (i.e., through the wafer) instead of the bottom side. By adjusting the size of the beam it is possible to release individual dice without the use of custom ejector tools.

It is noted that the base layer 208 is typically formed from a UV or thermally releasable material such as a UV or thermally releasable epoxy.

The described mount tape can be used to efficiently, quickly and inexpensively apply an adhesive layer to the back surface of a wafer. The thickness of the adhesive material 306 on the back surface of the dice depends in large part on the thickness of the adhesive layer 206 and therefore generally can be controlled by defining the thickness of the adhesive layer 206 in the mount tape. The thickness of the adhesive layer and the resulting protective coating 306 may be widely varied based on the perceived needs of any particular situation. By way of example, adhesive layer thicknesses in the range of 12 to 50 microns are readily obtainable.

The described process can be used with wafers of virtually any thickness. However, it should be apparent to those familiar with the art that some of the advantages are particularly noticeable when applied to very thin wafers and dice. As will be appreciated by those familiar with the art, some current designs call for thinning the wafers to thicknesses on the order of as little as 50 microns and it is expected that thinning wafers to thicknesses of less than approximately 10-15 microns will become more common in the near future. The handling of such thin and delicate wafers becomes a significant problem. The mounting tape 205 can help provide structural support to the wafer during various post thinning wafer handling operations.

The use of the B-stageable adhesive layer permits the adhesive to be applied at the wafer level, which can simplify and potentially reduce the amount die handling required in the die attach process. The expansion property of the thermal release layer provides a mechanism for separating individual dice from adjacent dice in a manner that does not unduly stress ultra-thin dice.

Figure 3:
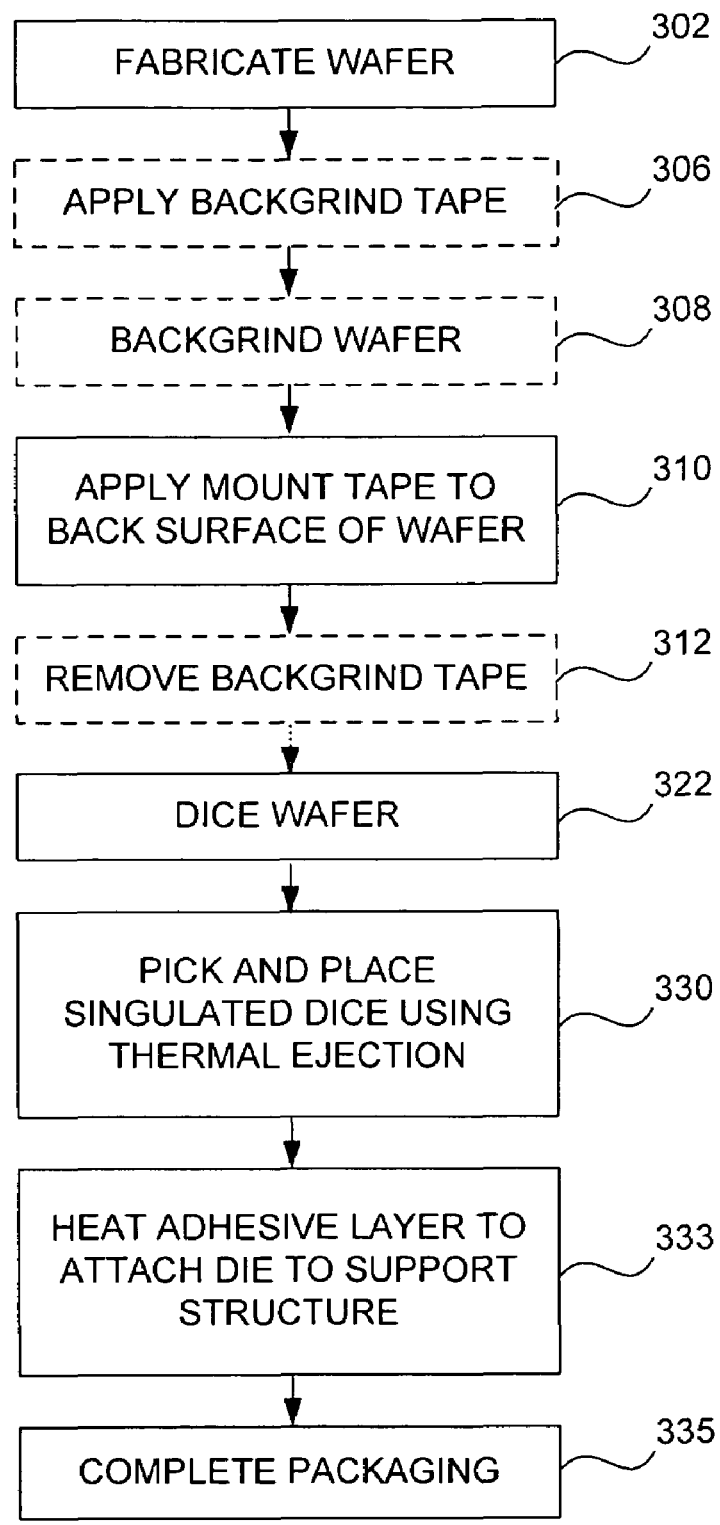
FIG. 3 is a process flow diagram illustrating a method of packaging a die that facilitates applying a B-stageable adhesive coating to the back surface of a wafer using a mount tape in accordance with one embodiment of the present invention.

Referring next to FIG. 3, a representative wafer finishing and die attach process that incorporates the present invention will be described. In this particular embodiment, the adhesive layer is thermally cured after the die has been placed on its supporting structure to firmly adhere the die to the support.

Initially, a wafer is fabricated in a conventional manner in step 302. As noted above, a wafer will typically have several hundred to several thousand dice formed thereon, and some have more than twenty thousand dice. If it is desirable to thin the wafer, a backgrind tape 202 may be applied to the active surface 110 of the wafer 100 at operation 306. The backgrind tape allows the wafer to be held firmly in place during a backgrind operation 308. Backgrinding allows the wafer to be brought into conformance with a desired thickness. Backgrinding may be accomplished by any of a number of methods known in the art. It should be appreciated that backgrinding is an entirely optional operation as the wafer may be in conformance to a desired thickness without backgrinding.

After the wafer has been background, a multi-layered mounting tape 205 is secured to the back surface of the wafer (310). Once the mounting tape 205 is secured to the wafer, the backgrind tape 202 may be removed (312). The backgrind tape 202 may be removed from the active surface of the wafer 110 thereby exposing the I/O pads 106, which allows for probing (testing) of the wafer as well as any other subsequent wafer level manufacturing processes and/or operations.

After any other desired wafer level processing is finished, the wafer 100 is diced or singulated (322). Dicing is the process of separating IC devices residing on a wafer. The size of individual devices is variable and depends on the configuration requirements of the manufacturer. Dicing may be accomplished in any of a number of suitable manners including sawing or laser cutting. As can be seen in reference to FIG. 2(c), the singulation cut 210 fully separates both the device and the adhesive layer 206. As discussed above, the cut may or may not pass entirely through the release layer 207, but it does not fully cut through the base layer 208. In this manner, the individual devices, which are typically quite small, remain held in place by the base layer. The devices may then readily be tested or further group processed in a wafer like manner as desired for a particular device.

After the wafer 100 is diced (322) and any other desired wafer group processing or testing is completed, the singulated dice may be individually picked and placed (330). Of course, if the pick and place equipment is adapted to simultaneously pick multiple integrated circuits, multiple dice may be released and picked as a group.

More specifically, in the described embodiment, a localized region of the wafer mount tape 205 underlying a selected die is heated to the activation temperature using any appropriate means of thermal ejection. The heating of the localized area underlying the selected die causes the release layer 207 to lose its adhesion and expand, thereby separating the selected die from the base layer and raising it above its neighboring dice that are not overlying the heated area. Since the wafer sawing operation cut through the wafer substrate 204, the adhesive layer 206 and the thermal release layer 207 of the tape 205, the selected die and the corresponding portion of the adhesive layer are free to rise independent of the adjacent dice. Conventional pick and place machinery can then be used to pick the elevated die and place it in a desired location.

As will be appreciated by those familiar with semiconductor packaging, in some situations, the singulated dice will be placed on a carrier tape (or other carrier mechanism) for transportation to a remote location where the dice will be packaged. In other situations, the pick and place machinery may directly place the singulated dice into a package structure. It should be appreciated that the B-stageable adhesive is normally solid at room temperature and therefore, the singulated dice are well suited for any necessary handling and/or transportation.

As previously described, the dice may be used in a wide variety of package styles. For example, the die may be placed on the die attach pad of a lead frame or in the die attach area of a substrate. Once the die is positioned in its desired location, the adhesive layer 306 may be heated using conventional techniques to firmly adhere the die to its supporting structure (333). In the primary described embodiments, the B-stageable adhesive layer is heated to a suitable curing temperature, which causes the adhesive to firmly adhere to both the die and the substrate thereby attaching the die to the substrate. After a die has been attached to a suitable support structure, it may be packaged as desired using any conventional or appropriate packaging techniques (335).

In some implementations, the B-stageable adhesive 206/306 is thermally cured and the release layer 207 is thermally released. In such instances, it is preferable to design the B-stageable adhesive such that its cure temperature is significantly above the release temperature of the release layer. By way of example, critical temperature differences of on the order of at least 30 degrees centigrade work well. With this arrangement, the release layer may be released by heating it to a temperature that is above its release temperature but below the curing temperature of the B-stageable adhesive. Alternatively, the release layer could even be heated to a temperature at or slightly above the B-stageable adhesive's curing temperature, so long as the heating is for a very brief time period (as for example, less than a second).

The adhesive layer 306 on an isolated die may be used to attach the die to any suitable support structure and may be used in a wide variety of packages. For example, the dice may be adhered to lead frames or any of a wide variety of substrate materials. The adhesive layer may be used to attach the die to another die or to a package structure in a stacked multi-chip package. The described dice can be used in any virtually any package style and any form factor that requires the back surface of the die to be adhesively attached to another structure. By way of example, they may be used in conventional leadframe base packages such as quad flat packs, dual or single in-line packages; in leadless leadframe based packages such as QFN packages; in substrate based packages such as grid array packages; and in stacked die packages having virtually any form factor.

Although only a few embodiments of the invention have been described in detail, it should be appreciated that the invention may be implemented in many other forms without departing from the spirit or scope of the invention. In the described embodiments, the base layer and the release layer are described as different layers. It is contemplated that in other embodiments, the base layer and the release layer may be integrated into a single layer.

In the primary described embodiments, a three layered mounting tape 205 has been used. In other embodiments additional layers may be provided in the mounting tape. By way of example, if it is desirable to mark the back surface of the dice, a releasable pigment layer could be added to the mounting tape to facilitate marking the dice. The use of such a pigment layer is described in U.S. patent application Ser. No. 10/830,818, which is incorporated herein by reference. Of course, additional layers could be provided for a wide variety of other purposes as well.

The invention has been primarily described in the context of using a thermally releasable adhesive as the expandable release layer because such materials are currently commercially available. However, it should be appreciated that other adhesive materials that exhibit the required expansion and releasing properties may be used as well. For example, it is believed that it would be possible to develop UV releasable epoxies having similar properties.

In the preceding discussions specific ordering of the steps has been described. However, it should be apparent that in many situations, some of the steps (e.g., backgrinding, sorting, testing, etc.) are entirely optional and that several other steps (e.g., marking, bumping, additional testing, etc.) may be added without departing from the invention. Additionally, it should be apparent that the order of many of the steps may be varied. Therefore, the present embodiments are to be considered as illustrative and not restrictive and the invention is not to be limited to the details given herein, but may be modified within the scope and equivalents of the appended claims.

What is claimed is:

1. A wafer level method of placing an adhesive layer on the back surface of integrated circuit devices using a mounting tape, the method comprising:
   (a) adhering a wafer to a mounting tape having a B-stageable adhesive layer, an expandable thermal release layer and a base layer;
   (b) dicing the wafer while the wafer is attached to the mounting tape, wherein the dicing is arranged to cut entirely through the adhesive layer but not fully through the base layer;
   (c) heating a selected portion of the mount tape in a region under a selected die formed in the wafer, wherein the selected portion of the mount tape is heated to a temperature sufficient to release the thermal release layer and to cause the thermal release layer to lift the selected die relative to at least one adjacent die in the wafer and wherein the portion of the B-stageable adhesive associated with the selected die remains adhered to the selected die;
   (d) picking the selected die from the wafer;
   (e) repeating steps (c) and (d) for different selected dice to facilitate sequential releasing and picking of the selected dice;
   (f) whereby the released dice have a B-stageable adhesive layer on their back surface that may be used as a die attach adhesive to attach the respective dice to associated substrates.

2. A method as recited in claim 1 wherein the dice are individually sequentially released and picked from the wafer mount tape.

3. A method as recited in claim 1 wherein multiple dice are simultaneously released.

4. A method as recited in claim 1 further comprising:
   (g) placing a selected die on an associated substrate;
   (h) heating the adhesive layer on the selected die to a temperature suitable to cause the adhesive to adhere the selected die to the substrate.

5. A method as recited in claim 4 further comprising repeating steps (g) and (h) for different selected dice.

6. A method as recited in claim 1 wherein the dicing is arranged to cut substantially through the thermal release layer in addition to the adhesive layer and the wafer.

7. A wafer mount tape comprising:
   a base layer;
   a B-stageable adhesive layer; and
   an expandable thermal release layer positioned between the base layer and the B-stageable layer wherein the thermal release layer that is in contact with a surface of the B-stageable layer and is arranged to expand when heated to an activation temperature, the expandable release layer further being arranged to strongly adhere the B-stageable adhesive layer to the base layer before the release layer is released by activation and to release the B-stageable adhesive layer from the base layer after the release layer is activated such that the B-stageable layer may be readily separated from the base layer and the thermal release layer after activation to thereby expose the surface of the B-stageable layer that was in contact with the thermal release layer; and
   wherein an activation temperature for the release layer is lower than a cure temperature for the B-stageable adhesive layer.

8. An arrangement comprising:
   a wafer mount tape as recited in claim 7; and
   a semiconductor wafer attached to the wafer mount tape, the wafer having a thickness of less than approximately 20 microns, the semiconductor wafer having a plurality of dice formed therein; and
   wherein the B-stageable adhesive adheres to the semiconductor wafer sufficiently to facilitate wafer sawing but is not fully cured; and
   wherein when a portion of the wafer mount tape under a selected die is heated to at least the activation temperature, the selected die will be released and lifted relative to dice whose underlying release layer segments have not been heated to the activation temperature such that the selected die may be picked and placed; and
   whereby after a selected die is singulated and placed on a desired substrate, the B-stageable adhesive may be used to secure the selected die to the substrate.

* * * * *